(12) United States Patent
Yamazaki et al.

(10) Patent No.: US 7,102,445 B2
(45) Date of Patent: Sep. 5, 2006

(54) POWER AMPLIFIER MODULE

(75) Inventors: Kazutaka Yamazaki, Kakegawa (JP); Ichiro Kato, Kosai (JP); Shigeru Kataoka, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 94 days.

(21) Appl. No.: 11/030,968

(22) Filed: Jan. 10, 2005

(65) Prior Publication Data

US 2005/0174178 A1    Aug. 11, 2005

(30) Foreign Application Priority Data

Feb. 10, 2004  (JP) .............................. 2004-033702

(51) Int. Cl.
*H03F 1/52* (2006.01)

(52) U.S. Cl. .................................... 330/298; 330/207 P

(58) Field of Classification Search ...................... None
See application file for complete search history.

(56) References Cited

U.S. PATENT DOCUMENTS 5,826,177 A * 10/1998 Uno ........................... 455/126

6,785,521 B1 * 8/2004 Hadjichristos et al. ...... 455/108

FOREIGN PATENT DOCUMENTS

| JP | 9-199950 | 7/1997 |
| JP | 9-284062 | 10/1997 |
| JP | 11-355054 | 12/1999 |

\* cited by examiner

*Primary Examiner*—Robert Pascal
*Assistant Examiner*—Hieu Nguyen
(74) *Attorney, Agent, or Firm*—McDermott Will & Emery LLP

(57) ABSTRACT

An amplifier 2c amplifies a transmit signal and outputs the amplified transmit signal to an antenna 10. A drive current for driving the amplifier 2c is inputted to a drive current input terminal 7. A current divider circuit 41 is provided between the drive current input terminal 7 and the amplifier 2c, and divides the drive current among a plurality of paths. The current divider circuit 41 includes a plurality of switching elements provided in the paths, respectively, and switched between a conduction state and a blocking state; and a resistance element 13 provided in at least one of the plurality of paths. A detection section 5 detects an electrical parameter in the resistance element. A control section 6 switches the plurality of switching elements between a conduction state and a blocking state, based on the electrical parameter detected by the detection section 5.

8 Claims, 13 Drawing Sheets

F I G. 3
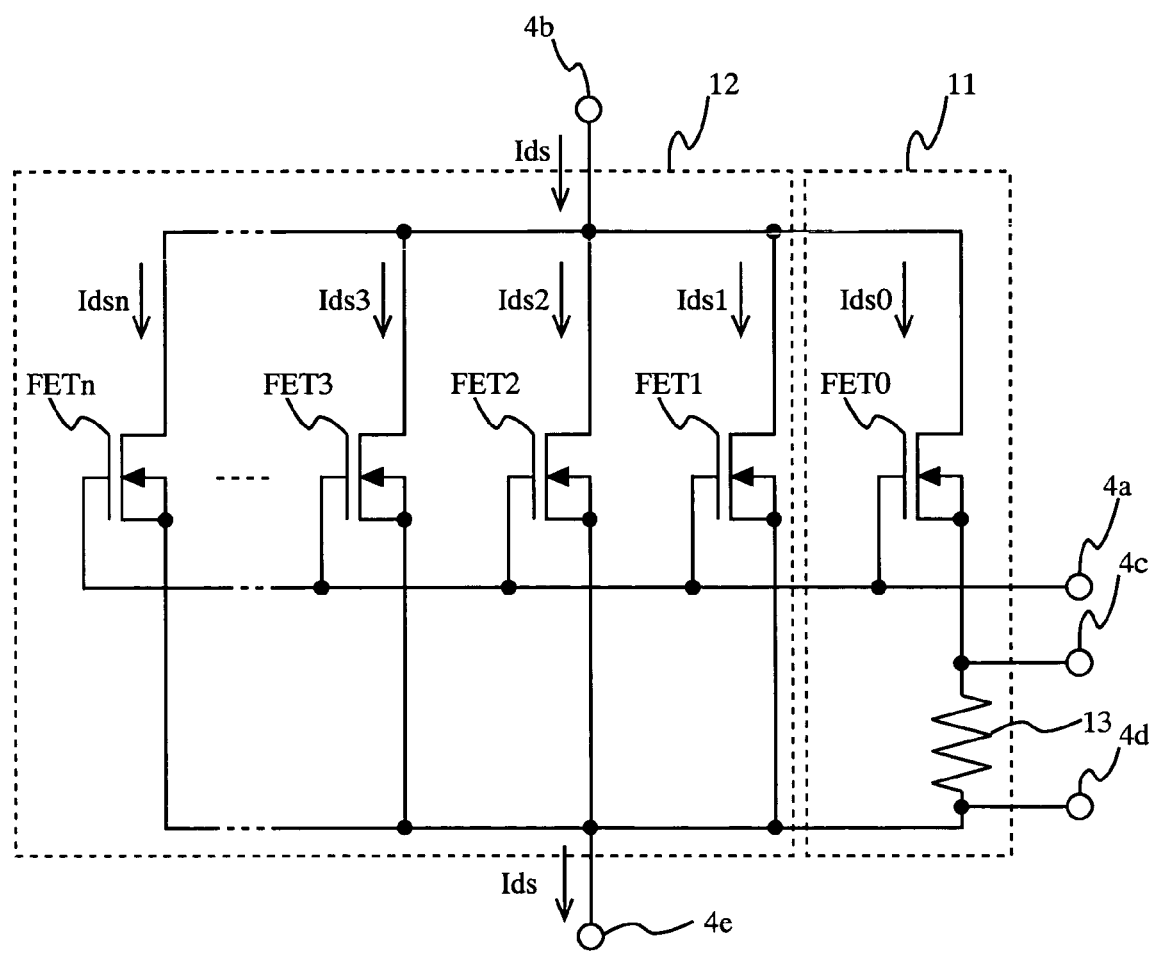

F I G. 5
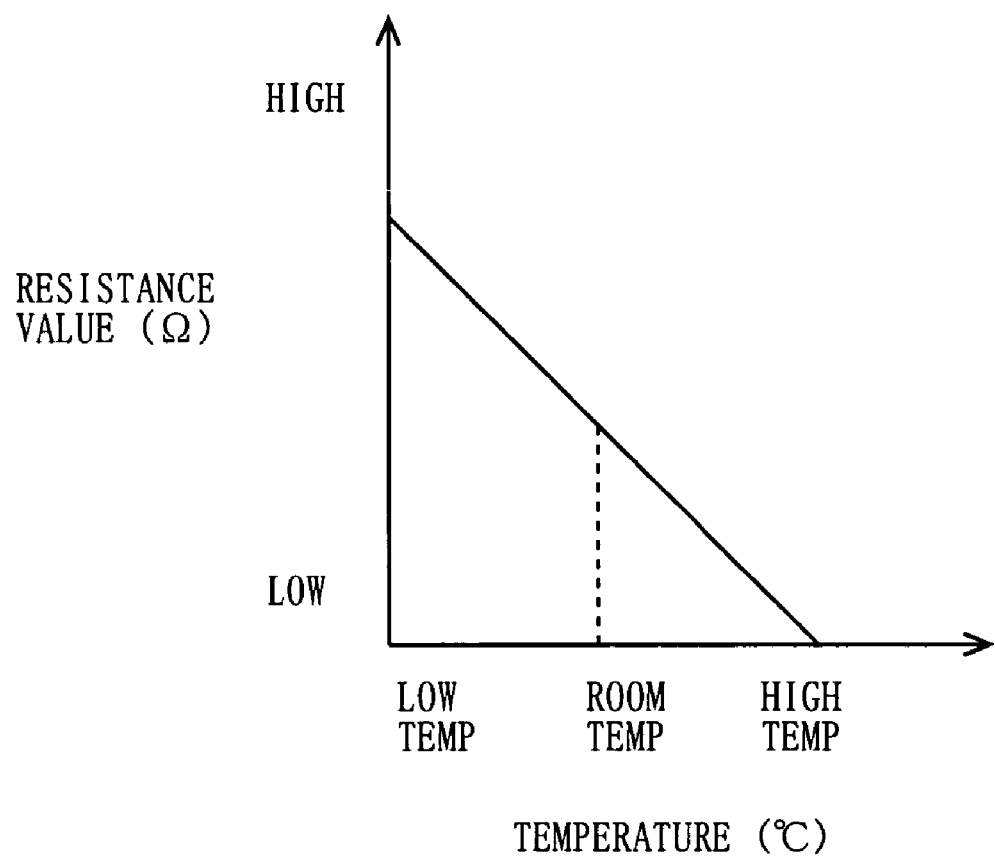

POWER AMPLIFIER MODULE

BACKGROUND OF THE INVENTION

1. Field of the Invention

The present invention relates to a power amplifier module, and in particular to a power amplifier module having the function of preventing an amplifier from being damaged due to overcurrent.

2. Description of the Background Art

Generally, in order to emit into space a carrier wave having information superimposed thereon, a wireless apparatus includes a power amplifier module for amplifying a signal to a sufficient level; and an antenna for emitting the carrier wave.

In the antenna, in order to efficiently transmit and receive signals, impedance matching is done in the transmit and receive frequency band. By thus doing matching, an output signal from the power amplifier can be emitted from the antenna. That is, reflected power is not inputted to the power amplifier module from the antenna.

However, if the antenna is damaged or broken for any reason, the matching is deteriorated. As a result, part of an input signal to the antenna from an output terminal of the power amplifier becomes reflected power, and the reflected power is inputted to the output terminal of the power amplifier. In this manner, if reflected power is inputted to the power amplifier, the reflected power is superimposed on the power of a transmit signal. Part of the power which includes the reflected power is consumed as heat by the power amplifier. As a result, the power amplifier causes thermal runaway due to an abnormal temperature increase and then causes overcurrent, whereby the power amplifier may be damaged.

The gain, output, and consumption current of the power amplifier are determined by the load conditions of the power amplifier. If the matching conditions of the antenna are changed by a reflected wave, the load conditions of the power amplifier change as well. Accordingly, due to the generation of the reflected wave, the impedance matching of the power amplifier changes and thereby overcurrent occurs, and as a result, the power amplifier may be damaged.

In order to prevent the power amplifier from being damaged, there exists a power amplifier module which detects, upon occurrence of overcurrent, an abnormal current increase in the power amplifier and suppresses the overcurrent. Specifically, a resistor is inserted in series with a power supply terminal of a power amplifier included in the power amplifier module. The voltage drop generated across the resistor is detected, and the consumption current of the power amplifier is detected. Then, based on the detected consumption current, the consumption current of the power amplifier is controlled (see, for example, Japanese Laid-Open Patent Publication No. 09-199950). The above-described power amplifier module will be described below with reference to the drawing. FIG. 14 is a diagram illustrating a configuration of the power amplifier module.

The power amplifier module shown in FIG. 14 includes a power amplifier 101, a terminal 102, a switching circuit 103, a resistor 104, a drain current detection section 105, a gate voltage control section 106, a loop filter 107, a comparator 108, a terminal 109, a latch circuit 110, and a reset signal circuit 111. The circuit configuration of the power amplifier module will be described below.

The power amplifier 101 has a drain terminal D, a gate terminal G, and a source terminal S. The source terminal S is grounded. The loop filter 107 is connected to the gate terminal G. The resistor 104 is connected to the drain terminal D.

A power supply voltage Vdd is inputted to the switching circuit 103. One end of the resistor 104 is connected to the output side of the switching circuit 103, and the other end is connected to the drain terminal D. The drain current detection section 105 is connected to both ends of the resistor 104. Further, the drain current detection section 105 is connected to an input terminal of the gate voltage control section 106 and to an input terminal of the comparator 108. The gate voltage control section 106 is connected to the loop filter 107. The terminal 109 is connected to an input terminal of the comparator 108. An output terminal of the comparator 108 is connected to the latch circuit 110. The latch circuit 110 is connected to the reset signal circuit 111 and to the switching circuit 103. The roles of the components of the power amplifier module having the above-described circuit configuration will be described below.

The power amplifier 101 comprises a field-effect transistor (FET), for example, and amplifies a signal inputted from the terminal 102 with an amplification factor based on the magnitude of a drain current inputted to the drain terminal D, and then outputs the amplified signal to an antenna (not shown) The resistor 104 is a resistance element having a known resistance value. The drain current detection section 105 detects the voltage drop across the resistor 104 to detect the magnitude of the drain current, and then outputs a signal having a voltage based on the magnitude of the drain current.

Based on the voltage of the signal outputted from the drain current detection section 105, the gate voltage control section 106 controls the gate voltage of the power amplifier 101 through the loop filter 107. By this, an increase in the gate current of the power amplifier 101 is prevented.

The comparator 108 compares between the voltage of the signal outputted from the drain current detection section 105 and a reference voltage to be inputted from the terminal 109, and then outputs a comparison result. Specifically, if it is determined that the voltage of the signal outputted from the drain current detection section 105 is higher than the reference voltage, the comparator 108 outputs a low-level signal. On the other hand, if it is determined that the voltage of the signal outputted from the drain current detection section 105 is lower than the reference voltage, the comparator 108 outputs a high-level signal. The latch circuit 110 holds the signal outputted from the comparator 108. The reset signal circuit 111 outputs a reset signal to the latch circuit 110 to reset the latch circuit 110. The latch circuit 110 outputs the signal being held thereby to the switching circuit 103. If a low-level signal is outputted to the switching circuit 103 from the latch circuit 110, the switching circuit 103 switches from a conduction state to a blocking state.

The operation of the power amplifier module configured in the above-described manner will be described below. The following describes the operation of the power amplifier module performed when reflected power from the antenna is increased and thereby the drain current of the power amplifier 101 is increased.

In the case where the drain current of the power amplifier 101 is increased, the drain current detection section 105 detects an increase in drain current based on the voltage drop across the resistor 104. The gate voltage control section 106 controls the gate voltage of the power amplifier 101 through the loop filter 107. By this, an increase in drain current is inhibited.

Now, the case is described where the drain current is increased despite the control by the gate voltage control section 106. In this case, the signal level outputted from the drain current detection section 105 is higher than the reference voltage inputted from the terminal 109. Hence, the comparator 108 outputs a low-level signal. The latch circuit 110 acquires the low-level signal and then outputs the low-level signal to the switching circuit 103. Accordingly, the switching circuit 103 switches from a conduction state to a blocking state. That is, the drain current becomes zero. Thereafter, the latch circuit 110 is reset by the reset signal circuit 111.

By performing such operation, the conventional power amplifier module prevents the power amplifier 101 from being damaged. In power amplifier modules as disclosed in Japanese Laid-Open Patent Publications No. 09-284062 and No. 11-355054 too, a resistor is inserted in series between a power supply terminal and a power amplifier, and the current is detected through the voltage drop across the resistor.

The above-described conventional power amplifier modules, however, have the problem of an increase in consumption current, which will be described in detail below. In the above-described conventional power amplifier modules, the resistor is inserted in series with the power supply terminal, and the voltage generated across the resistor is detected. Therefore, the voltage dropped by the inserted resistor is applied to the power amplifier module. That is, due to the presence of the resistor, a loss occurs in the drain current of the power amplifier, resulting in an increase in the consumption current of the power amplifier module.

SUMMARY OF THE INVENTION

Therefore, an object of the present invention is to provide a power amplifier module capable of preventing a power amplifier from being damaged due to overcurrent caused by reflected power, and of reducing a loss of consumption current caused by the detection of the overcurrent.

In a power amplifier module according to the present invention, an amplifier amplifies a transmit signal and outputs the amplified transmit signal to an antenna. A drive current for driving the amplifier is inputted to a drive current input terminal. A current divider circuit is provided between the drive current input terminal and the amplifier, and divides the drive current among a plurality of paths. The current divider circuit includes a plurality of switching elements provided in the paths, respectively, and switched between a conduction state and a blocking state; and a resistance element provided in at least one of the plurality of paths. A detection section detects an electrical parameter in the resistance element. A control section switches the plurality of switching elements between a conduction state and a blocking state, based on the electrical parameter detected by the detection section.

By this configuration, it is possible to prevent the power amplifier from being damaged due to overcurrent caused by reflected power, and to reduce a loss of consumption current caused by the detection of the overcurrent. Specifically, in the power amplifier module according to the present invention, a drive current is divided among a plurality of paths. Thus, the drive current flowing through the resistor is lower than the drive current to be inputted to the power amplifier module. Hence, the voltage drop occurring in the resistor becomes smaller than that of conventional cases. Accordingly, a loss of consumption current caused by the detection of overcurrent can be reduced.

In the power amplifier module according to the present invention, a thermal element may be used as the resistance element. By this, it is possible to prevent the amplifier from causing thermal runaway. This will be described in detail below. The amplifier has properties that when used in a high-temperature environment, the amplifier causes thermal runaway and is thereby damaged at a lower current than the current at which the amplifier used in a room temperature environment is damaged. Thus, in the case where the amplifier has reached a high temperature, the switching elements need to be controlled to be in a blocking state at the time when a lower current than the current at which the amplifier used in room temperatures is damaged is detected.

For this reason, a thermal element having a negative temperature coefficient is used as the resistance element. With such a thermal element, as the temperature of the amplifier increases, the temperature around the thermal element increases, and thus the resistance value of the thermal element decreases. Hence, the magnitude of a current to be detected increases. Accordingly, the current more easily exceeds a predetermined threshold value in the control section. That is, the possibility that the switching elements are controlled to be in a blocking state is higher in a high-temperature environment than in a low-temperature environment. Accordingly, thermal runaway of the amplifier can be prevented.

By arranging a plurality of thermal elements, it becomes possible to detect temperatures at a plurality of points in the power amplifier module. This makes it possible to control the switching elements more precisely.

The detection section may detect a value of a current flowing through the resistance element as the electrical parameter.

Alternatively, if the detection section detects a current value greater than a predetermined current value, the control section may switch all of the switching elements from a conduction state to a blocking state.

The plurality of switching elements may be composed of transistors, and if the detection section detects a current value greater than the predetermined value, the control section may apply a threshold voltage at which the transistors are switched to a conduction state from a blocking state, to control electrodes of the transistors. The threshold voltage is, for example, a voltage equal to the magnitude of a voltage drop occurring in the resistance element when a drive current having a magnitude at which the amplifier is damaged flows through the resistance element.

The detection section may detect a potential difference generated across the resistance element as the electrical parameter.

The resistance element may be a thermal element having properties that a resistance value decreases as a temperature of a periphery of the resistance element increases.

The thermal element may be provided in two or more of the plurality of paths, and the detection section may detect a highest current among currents of the thermal elements.

The amplifier may be composed of a plurality of amplification transistors provided so as to correspond to the plurality of paths, respectively, and the amplification transistors each may amplify the transmit signal using drive currents flowing through their corresponding paths.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram illustrating another exemplary configuration of the current control circuit according to the first embodiment;

FIG. 5 is a diagram showing the characteristics of a thermal element VR;

DESCRIPTION OF THE PREFERRED EMBODIMENTS (First Embodiment)

Figure 1:
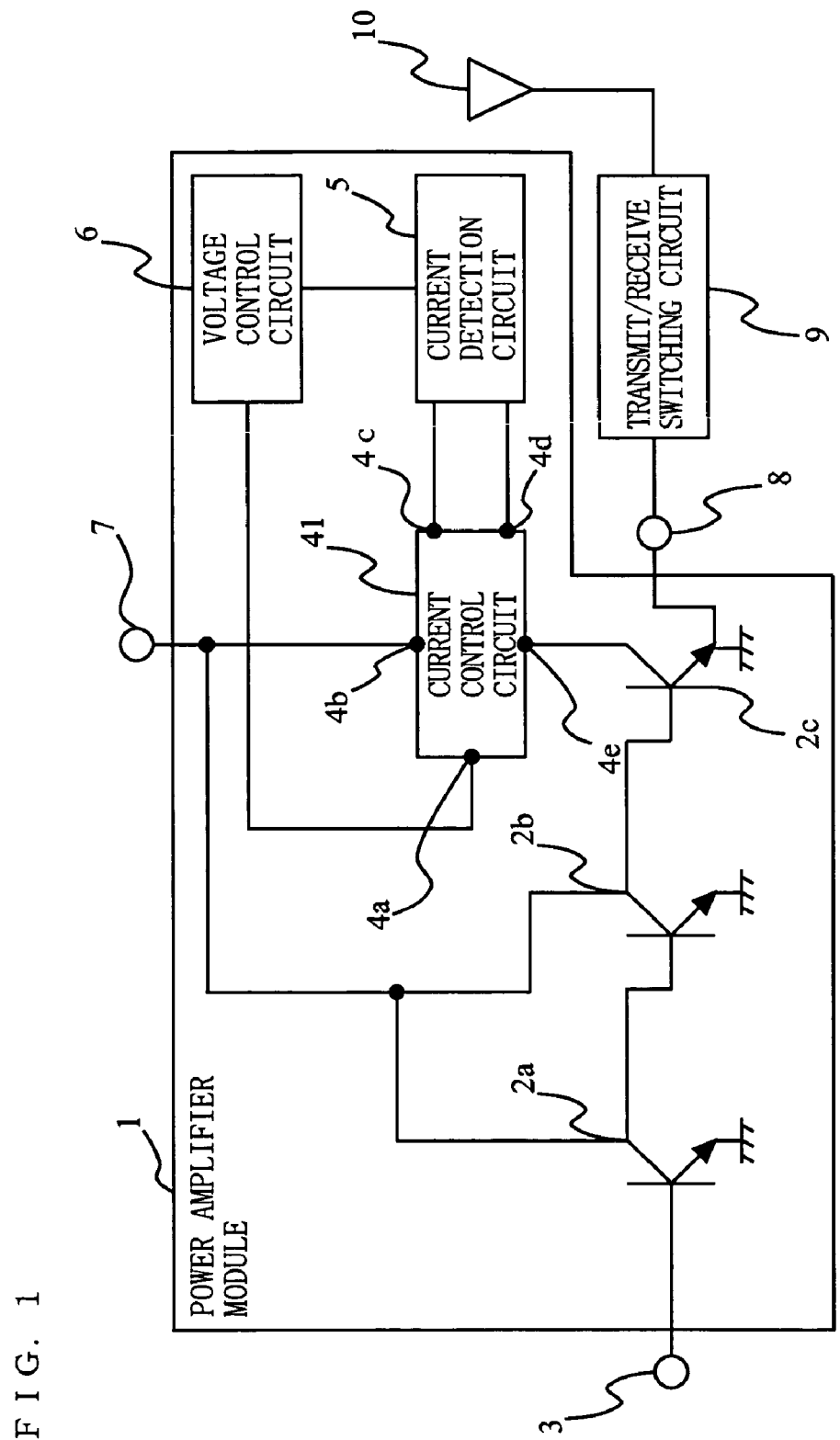
FIG. 1 is a diagram illustrating a configuration of a power amplifier module according to a first embodiment.

With reference to the drawings, a power amplifier module according to a first embodiment of the present invention will be described below. In order to prevent a power amplifier from being damaged due to reflected power from the antenna side, the power amplifier module according to the present embodiment has the function of detecting the magnitude of an electrical parameter, such as the consumption current of the power amplifier, and controlling the magnitude of the consumption current. Further, the power amplifier module according to the present embodiment can reduce a loss of consumption current which occurs when detecting the consumption current. FIG. 1 is a diagram illustrating a configuration of the power amplifier module.

The power amplifier module shown in FIG. 1 includes a first amplification circuit 2a, a middle amplification circuit 2b, a last amplification circuit 2c, an input terminal 3, a current detection circuit 5, a voltage control circuit 6, a power supply terminal 7, an output terminal 8, a transmit/receive switching circuit 9, and a current control circuit 41. In addition, an antenna 10 is connected to the power amplifier module via the output terminal 8.

A transmit signal is inputted to the input terminal 3. The first amplification circuit 2a amplifies the power of the transmit signal inputted from the input terminal 3, and then outputs the amplified transmit signal to the middle amplification circuit 2b. The middle amplification circuit 2b amplifies the power of the transmit signal amplified by the first amplification circuit 2a, and then outputs the amplified transmit signal to the last amplification circuit 2c. The last amplification circuit 2c amplifies the power of the transmit signal amplified by the middle amplification circuit 2b, and then outputs the amplified transmit signal to the antenna 10 through the output terminal 8 and the transmit/receive switching circuit 9. The first amplification circuit 2a, the middle amplification circuit 2b, and the last amplification circuit 2c may be composed of npn bipolar transistors, for example. In the case where the first amplification circuit 2a, the middle amplification circuit 2b, and the last amplification circuit 2c are composed of npn bipolar transistors, the circuits are connected in the manner shown in FIG. 1. Specifically, the input terminal 3 is connected to the base of the first amplification circuit 2a, and the emitter of the first amplification circuit 2a is grounded. The collector of the first amplification circuit 2a is connected to the base of the middle amplification circuit 2b, and the emitter of the middle amplification circuit 2b is grounded. The collector of the middle amplification circuit 2b is connected to the base of the last amplification circuit 2c, and the emitter of the last amplification circuit 2c is grounded. The collector of the last amplification circuit 2c is connected to the output terminal 8. Note that the first amplification circuit 2a, the middle amplification circuit 2b, and the last amplification circuit 2c may be composed of amplification elements such as FETs or heterojunction bipolar transistors.

The output terminal 8 outputs to the transmit/receive switching circuit 9 the transmit signal outputted from the last amplification circuit 2c. The transmit/receive switching circuit 9 switches the connection state between the power amplifier module and the antenna 10 from one to another. Specifically, the transmit/receive switching circuit 9 connects between the power amplifier module and the antenna 10 during transmission, and connects between the power amplifier module and a receiving circuit (not shown) during reception. The antenna 10 emits a transmit signal in the form of a radio wave, and also receives a receive signal transmitted in the form of a radio wave.

Figure 2:
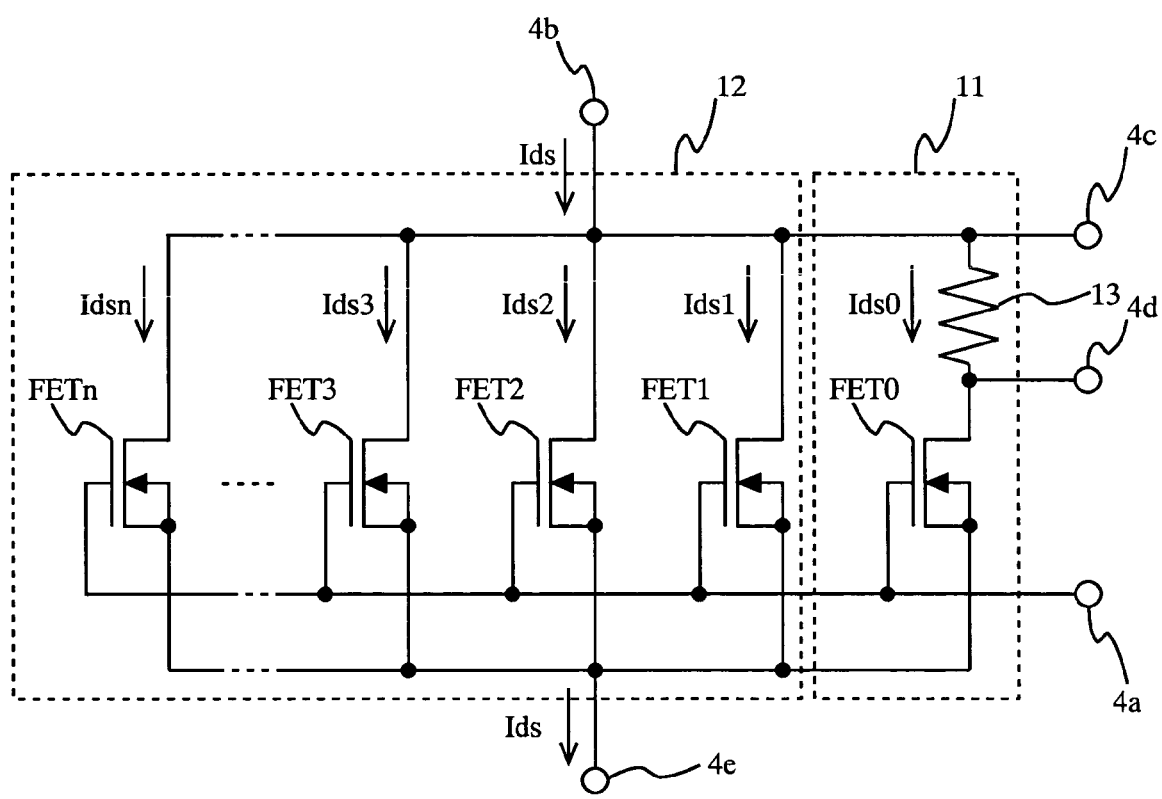
FIG. 2 is a diagram illustrating an exemplary configuration of a current control circuit according to the first embodiment.

The power supply terminal 7 supplies consumption current for driving the first amplification circuit 2a, the middle amplification circuit 2b, and the last amplification circuit 2c. The current control circuit 41 is provided between the power supply terminal 7 and the last amplification circuit 2c, and controls the amount of supply of consumption current to the last amplification circuit 2c, based on the control by the voltage control circuit 6. The current control circuit 41 is characterized in that the resistance value is lower than that of conventional current control circuits. The current control circuit 41 will be described in detail below with reference to the drawings. FIG. 2 is a circuit diagram illustrating the detail of the current control circuit 41.

The current control circuit 41 includes a first terminal 4a, a second terminal 4b, a third terminal 4c, a fourth terminal 4c, a fifth terminal 4e, a current detection section 11, and a current control section 12. The current detection section 11 has a resistor 13 and a transistor FET0. The current control section 12 has transistors FET1 to FETn (n is a natural number). The circuit configuration of the current control circuit 41 will be described below.

In the current control circuit 41 according to the present embodiment, there are n+1 branch paths between the fourth terminal 4d and the fifth terminal 4e, and one Nch transistor FET is arranged in each path. In the path in which the transistor FET0 is arranged, the resistor 13 is arranged. In order that the transistors FET0 to FETn can be simultaneously switched between a conduction state and a blocking state, the transistors FET0 to FETn are connected to one another by a common signal line. The configuration of the current control circuit 41 will be described in detail below.

The gates of the transistors FET0 to FETn are connected to the first terminal 4a. In addition, as shown in FIG. 1, the first terminal 4a is connected to the voltage control circuit 6. The drains of the transistors FET1 to FETn and the resistor 13 are connected to the second terminal 4b. In addition, as shown in FIG. 1, the second terminal 4b is connected to the power supply terminal 7. The resistor 13 and the drain of the transistor FET0 are connected to each other. The third terminal 4c and the fourth terminal 4d are connected to both ends of the resistor 13, respectively. The fifth terminal 4e is connected to the sources of the transistors FET0 to FETn.

The roles of the components of the current control circuit 41 configured in the above-described manner will be described below. A control signal from the voltage control circuit 6 is inputted to the first terminal 4a. A consumption current Ids from the power supply terminal 7 is inputted to the second terminal 4b. When the transistors FET0 to FETn are in a conduction state, the consumption current Ids is divided among the n+1 paths. Here, the consumption currents flowing through the transistors FET0 to FETn are referred to as consumption currents Ids0 to Idsn, respectively. The resistor 13 causes a voltage drop when the consumption current Ids0 flows across the resistor 13. The third terminal 4c and the fourth terminal 4d output potentials at their respective locations. That is, the potential difference between the third terminal 4c and the fourth terminal 4d is the voltage drop occurred in the resistor 13.

The transistors FET0 to FETn are switches for switching their corresponding paths between a conduction state and a blocking state. The transistors FET0 to FETn may be formed by the same fabrication process and on the same semiconductor substrate, for example. Therefore, the characteristics are consistent from transistor to transistor, and thus characteristic differences among individuals are assumed to be negligible. Note that the transistors FET0 to FETn are not limited to FETs, and may be active elements such as bipolar transistors or heterojunction bipolar transistors.

Referring back to the description of FIG. 1, the current detection circuit 5 detects the magnitude of the consumption current Ids inputted from the power supply terminal 7. Specifically, the current detection circuit 5 reads the potential difference between the third terminal 4c and fourth terminal 4d of the current control circuit 41, and then determines a consumption current Ids0 based on the potential difference and the resistance value of the resistor 13. Here, since the transistors FET0 to FETn all have the same characteristics, if the resistance value of the resistor 13 is very low, the resistance values of all the paths become substantially the same. Therefore, the relationship such that Ids0=Ids1=Ids2= . . . Idsn is established. That is, the relationship such that Ids=(n+1)Ids0 is established. Accordingly, the current detection circuit 5 can determine the magnitude of the consumption current Ids by determining the magnitude of the consumption current Ids0. The current detection circuit 5 having determined the magnitude of the consumption current Ids outputs a signal based on the magnitude of the consumption current.

Based on the signal outputted from the current detection circuit 5, the voltage control circuit 6 generates a control signal for switching the transistors FET0 to FETn between a conduction state and a blocking state. Specifically, if the voltage of the signal outputted from the current detection circuit 5 is higher than a predetermined threshold value, the voltage control circuit 6 generates only for a predetermined period of time a control signal having a voltage lower than a threshold voltage at which the transistors FET0 to FETn are switched to a blocking state. On the other hand, if the voltage of the signal outputted form the current detection circuit 5 is lower than the predetermined threshold value, the voltage control circuit 6 outputs a control signal having a voltage higher than the threshold voltage. Note that the predetermined threshold value is, for example, a voltage value to be outputted from the current detection circuit 5 when the current detection circuit 5 has detected a consumption current Ids having a magnitude at which the last amplification circuit 2c is damaged.

The power amplifier module configured in the above-described manner will be described below with reference to the drawings. First, in normal conditions, the current detection circuit 5 outputs to the voltage control circuit 6 a signal having a voltage lower than a predetermined threshold value. The voltage control circuit 6 then outputs to the gates of the transistors FET0 to FETn a control signal having a voltage higher than the threshold voltage of the transistors FET0 to FETn. Accordingly, in the normal conditions, the transistors FET0 to FETn are controlled to be in a conduction state, and a consumption current Ids is supplied to the last amplification circuit 2c through the power supply terminal 7.

In such normal conditions, a transmit signal is inputted to the first amplification circuit 2a through the input terminal 3. The first amplification circuit 2a amplifies the transmit signal using the consumption current Ids supplied from the power supply terminal 7, and then outputs the amplified transmit signal to the middle amplification circuit 2b. The middle amplification circuit 2b further amplifies the transmit signal outputted from the first amplification circuit 2a using the consumption current Ids supplied from the power supply terminal 7, and then outputs the amplified transmit signal to the last amplification circuit 2c. The last amplification circuit 2c further amplifies the transmit signal outputted from the middle amplification circuit 2c using the consumption current Ids supplied from the power supply terminal 7, and then outputs the amplified transmit signal to the antenna 10 through the output terminal 8 and the transmit/receive switching circuit 9. The antenna 10 emits the transmit signal so as to be superimposed on a carrier wave.

In the case where the power amplifier module shown in FIG. 1 is used in a mobile terminal, a person or metal may come into contact with the antenna 10, for example, and accordingly the antenna 10 may be damaged. In such a case, the reflected power from the antenna side increases, and thereby the load conditions of the power amplifier module change. As a result, the consumption current Ids from the power supply terminal 7 to the last amplification circuit 2c increases to such an extent that the last amplification circuit 2c can be damaged. The following describes the operation of the power amplifier module performed in the above-described case.

The current control circuit 41 divides the consumption current Ids into consumption currents Ids0 to Idsn. When the consumption current Ids0 passes through the resistor 13, in the resistor 13 a voltage drop occurs having a magnitude which is the product of the resistance value of the resistor 13 and the magnitude of the consumption current Ids0. Therefore, a potential difference generated by the voltage drop occurs between the third terminal 4c and the fourth terminal 4d. The current detection circuit 5 determines the consumption current Ids. Note that the consumption current Ids can be determined by dividing the potential difference by the magnitude of the resistor 13. Further, since the relationship such that Ids=(n+1) Ids0 is established between the consumption current Ids and the consumption current Ids0, the consumption current Ids can be determined by multiplying the consumption current Ids0 by n+1. The current detection circuit 5 having detected the consumption current Ids outputs to the voltage control circuit 6 a signal having a voltage based on the consumption current Ids.

The voltage control circuit 6 compares between the voltage of the signal outputted from the current detection circuit 5 and a predetermined threshold value. Here, the consumption current Ids has a magnitude at which the last amplification circuit 2c is damaged. That is, the voltage of the signal outputted from the current detection circuit 5 is higher than the predetermined threshold value. Thus, the voltage control circuit 6 outputs for a predetermined period of time a control signal having a voltage lower than the threshold voltage of the transistors FET0 to FETn. By this, the transistors FET0 to FETn are controlled to be in a blocking state. Accordingly, the consumption current Ids does not flow through the last amplification circuit 2c, and thereby damage to the last amplification circuit 2c can be prevented. Note that after the predetermined period of time has elapsed, the voltage control circuit 6 outputs a control signal having a voltage higher than the threshold voltage of the transistors FET0 to FETn. Accordingly, the transistors FET0 to FETn are controlled to be in a conduction state, and the last amplification circuit 2c goes into operation again.

As described above, according to the power amplifier module of the present embodiment, it is possible to prevent the power amplifier from being damaged due to overcurrent caused by reflected power, and to reduce a loss of consumption current caused by the detection of the overcurrent. These advantages will be described in detail below with reference to the drawings.

Figure 14:
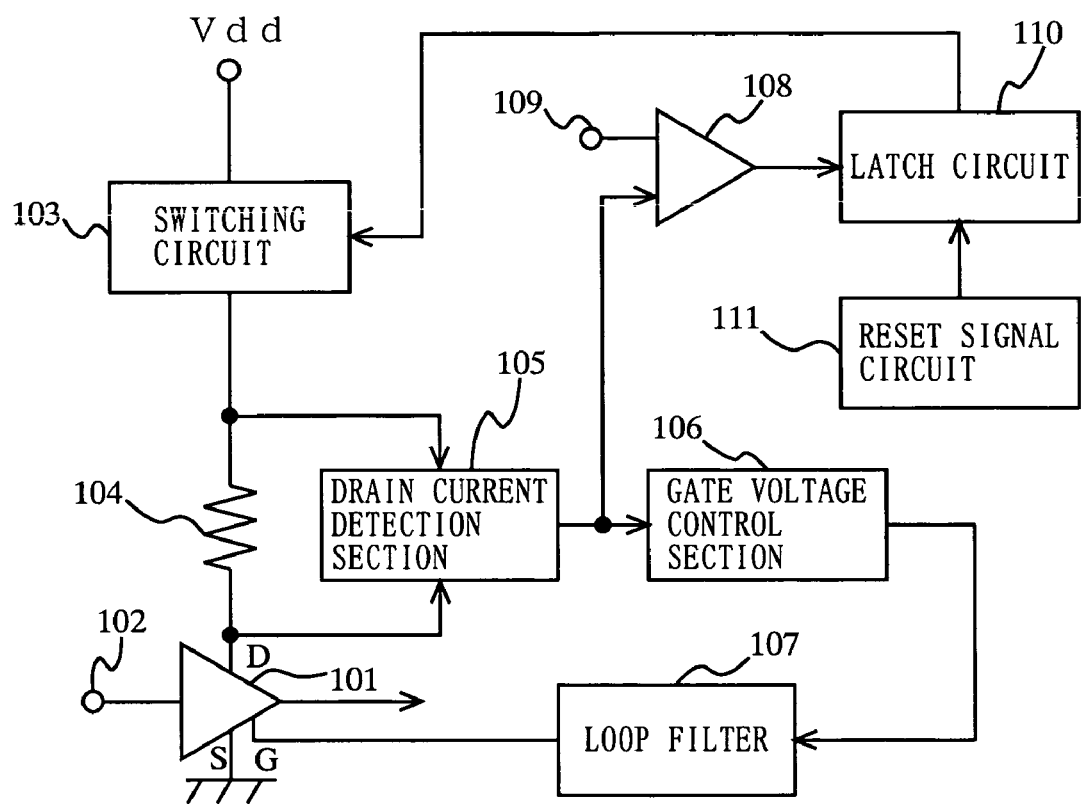
FIG. 14 is a diagram illustrating a configuration of a conventional power amplifier module.

In the conventional power amplifier module shown in FIG. 14, all consumption currents inputted from the power supply terminal pass through the resistor 104 and then are inputted to the power amplifier 101. Thus, in the resistor 104, a voltage drop occurs which is equal to the product of the magnitude of a consumption current supplied to the power amplifier 101 and the magnitude of the resistor 104.

On the other hand, in the power amplifier module according to the present embodiment, as shown in FIG. 2, a consumption current Ids is divided into consumption currents Ids0 to Idsn. Thus, the consumption current Ids0 flowing through the resistor 13 is about 1/n+1 of the consumption current Ids. Hence, the voltage drop occurring in the resistor 13 is smaller than that of conventional cases. Accordingly, a loss of consumption current caused by the detection of overcurrent can be reduced.

Note that although, in the power amplifier module according to the present embodiment, a consumption current is detected by the current detection circuit 5 and the conditions of the transistors FET0 to FETn are controlled based on the detected consumption current, the method of controlling the transistors FET0 to FETn is not limited thereto. For example, the current detection circuit 5 may detect the magnitude of a voltage drop in the resistor 13 instead of detecting a consumption current.

In addition, the configuration of the current control circuit 41 of the power amplifier module according to the present embodiment is not limited to that shown in FIG. 2. For example, as shown in FIG. 3, the positions of the transistor FET0 and the resistor 13 may be reversed relative to each other.

Figure 4:
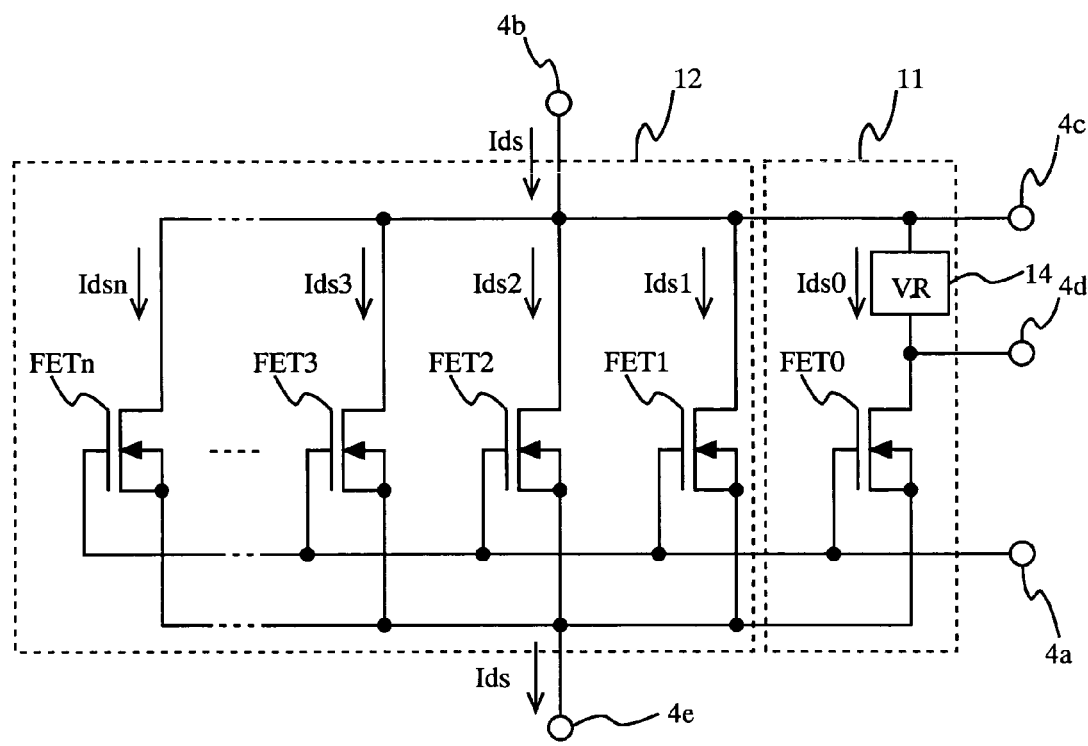
FIG. 4 is a diagram illustrating still another exemplary configuration of the current control circuit according to the first embodiment.

FIG. 4 is a diagram illustrating another exemplary configuration of the current detection circuit 41. The current control circuit 41 of the power amplifier module according to the present embodiment may have a configuration such as that shown in FIG. 4. Specifically, a thermal element (hereinafter referred to as "VR") 14 may be provided instead of the resistor 13. The VR 14 is an element whose resistance value changes with temperature. In the present embodiment, the VR 14 has a negative temperature coefficient which causes the resistance value to reduce as the temperature increases. A power amplifier module using the VR 14 instead of the resistor 13 will be described below with reference to the drawings. FIG. 5 is a graph showing the characteristics of the VR 14. Specifically, the vertical axis indicates a resistance value ($\Omega$) and the horizontal axis indicates a temperature (° C.).

The last amplification circuit 2c has properties that when used in a high-temperature environment, the last amplification circuit 2c causes thermal runaway and is thereby damaged at a lower consumption current Ids than the consumption current at which the last amplification circuit 2c used in a room temperature environment is damaged. Thus, in the case where the last amplification circuit 2c has reached a high temperature, the transistors FET0 to FETn need to be controlled to be in a blocking state at the time when the current detection circuit 5 detects a lower consumption current Ids than a consumption current Ids at which the last amplification circuit 2c used in room temperatures is damaged.

In view of this, the current control circuit 41 shown in FIG. 4 uses the VR 14 having a negative temperature coefficient instead of the resistor 13. By doing so, as the temperature of the last amplification circuit 2c increases, the temperature around the VR 14 increases, and thus the resistance value of the VR 14 decreases. Hence, the magnitude of a consumption current Ids to be detected by the current detection circuit 5 increases. Accordingly, the current detection circuit 5 outputs to the voltage control circuit 6 a signal having a voltage based on the magnitude of the consumption current Ids. The voltage control circuit 6 compares between a predetermined threshold value and the voltage outputted from the current detection circuit 5. Since the current detection circuit 5 outputs a signal having a voltage relatively higher than the voltage to be outputted at room temperatures, the voltage control circuit 6 is more likely to control the transistors FET0 to FETn to be in a blocking state in a high-temperature environment rather than in a low-temperature environment. As a result, thermal runaway of the last amplification circuit 2c can be prevented.

Figure 6:
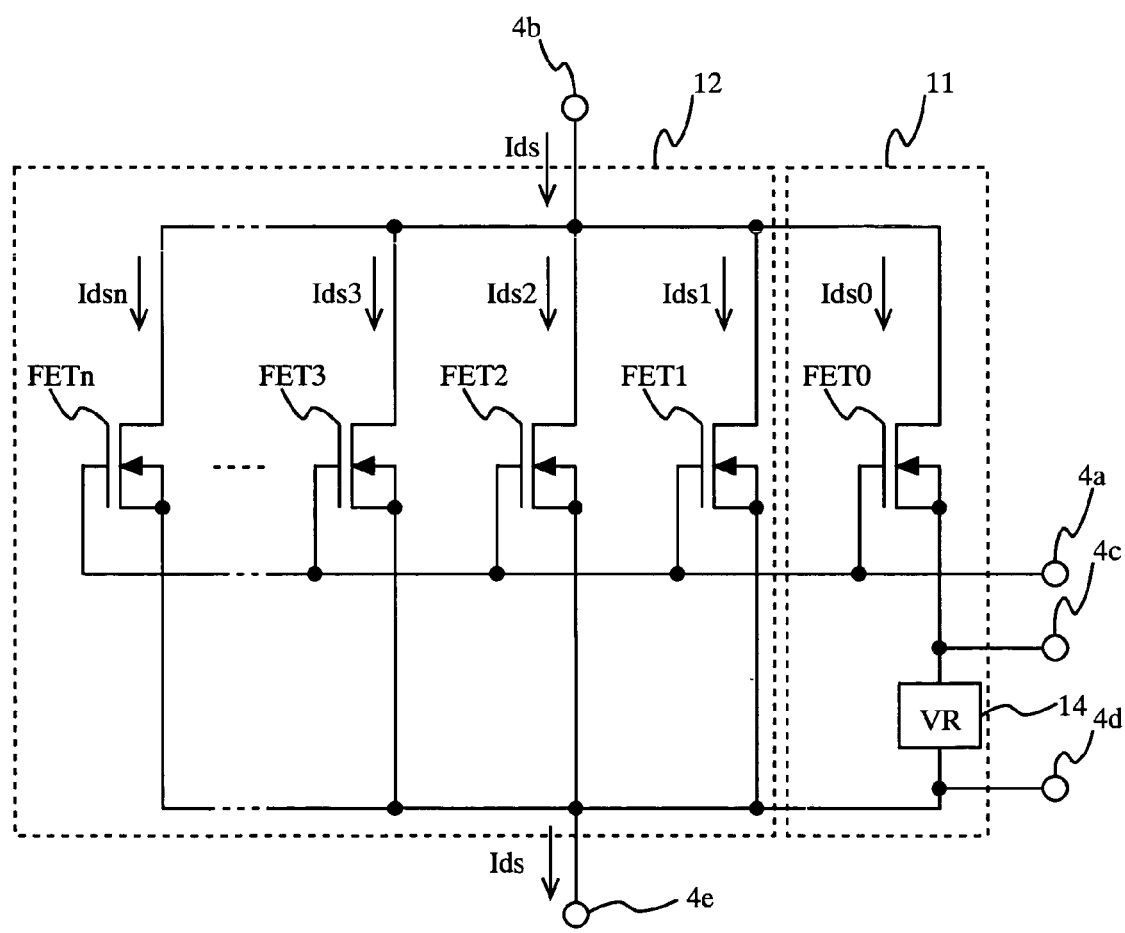
FIG. 6 is a diagram illustrating yet another exemplary configuration of the current control circuit according to the first embodiment.

Note that as shown in FIG. 6 the positions of the VR 14 and the transistor FET0 may be reversed relative to those shown in FIG. 4.

(Second Embodiment)

Figure 7:
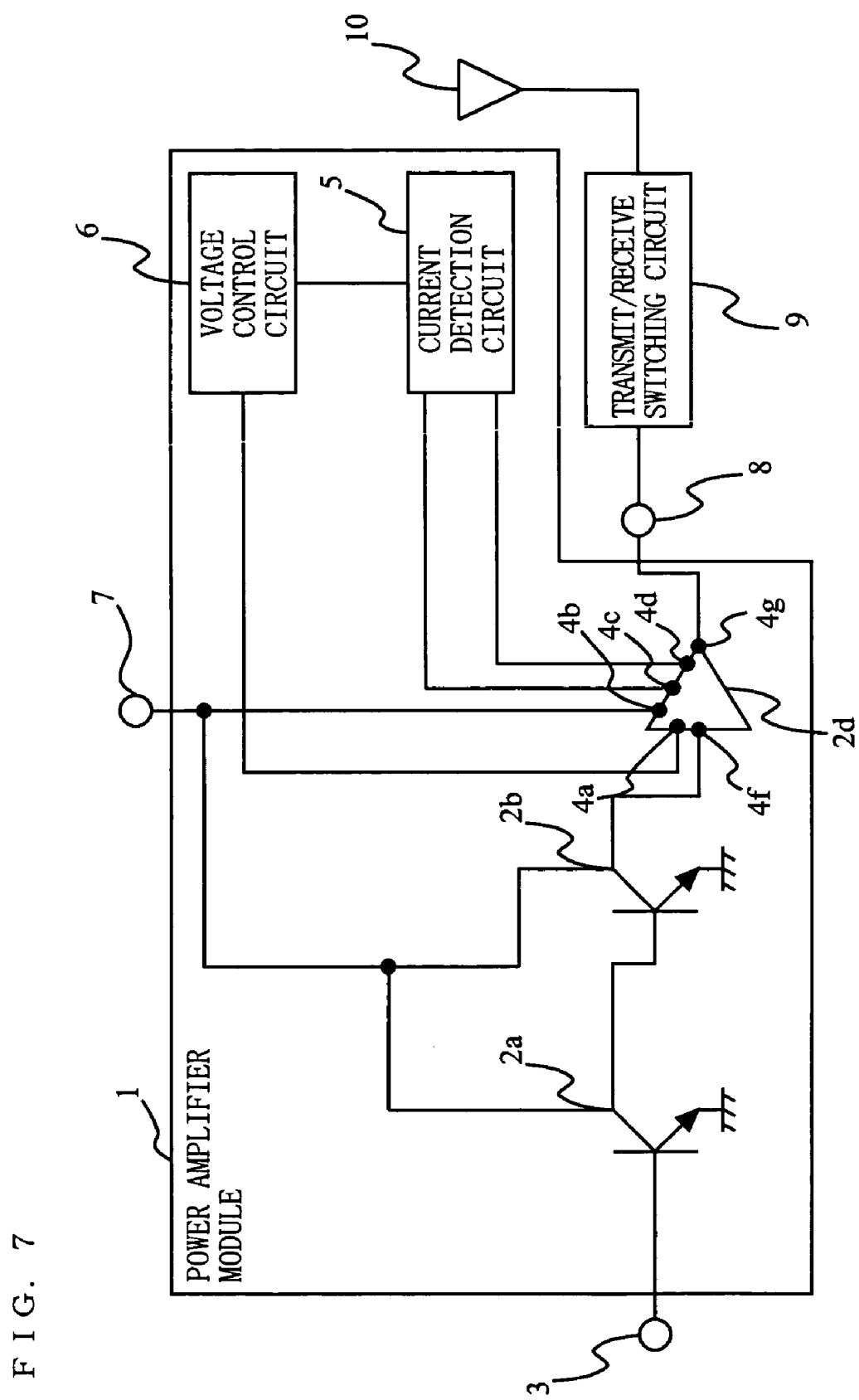
FIG. 7 is a diagram illustrating a configuration of a power amplifier module according to a second embodiment.

A power amplifier module according to a second embodiment of the present invention will be described below with reference to the drawings. The power amplifier module according to the present embodiment differs from the power amplifier module according to the first embodiment in that while in the first embodiment the last amplification circuit 2c and the current control circuit 41 are provided separately, in the present embodiment a current control function is incorporated in a last amplification circuit. FIG. 7 is a diagram illustrating a configuration of the power amplifier module according to the present embodiment.

The power amplifier module shown in FIG. 7 includes a first amplification circuit 2a, a middle amplification circuit 2b, a last amplification circuit 2d on which a current control circuit is mounted, an input terminal 3, a current detection circuit 5, a voltage control circuit 6, a power supply terminal 7, an output terminal 8, and a transmit/receive switching circuit 9. In addition, an antenna 10 is connected to the power amplifier module via the output terminal 8.

Figure 8:
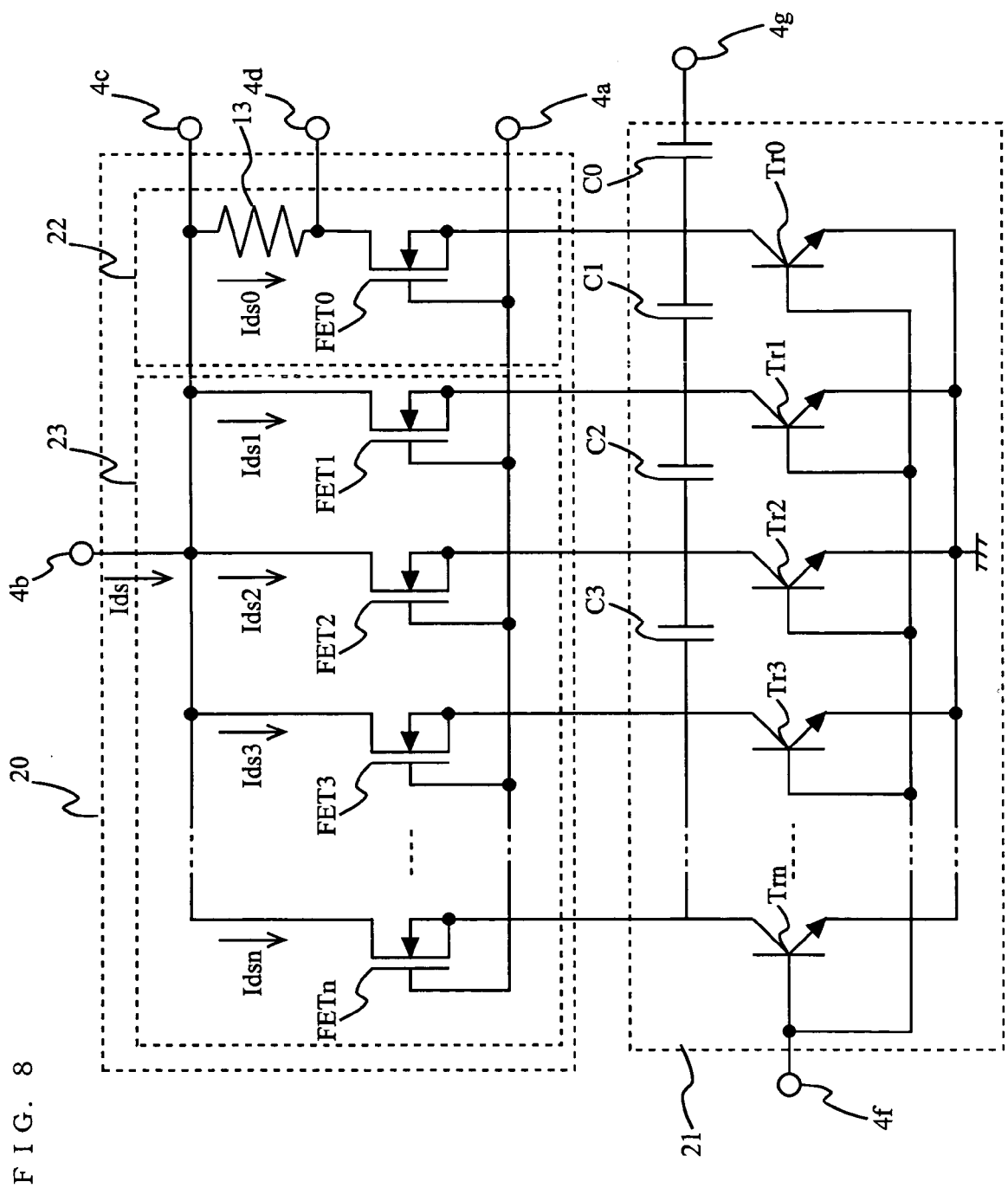
FIG. 8 is a diagram illustrating an exemplary configuration of a current control circuit according to the second embodiment.

Note that the input terminal 3, the first amplification circuit 2a, the middle amplification circuit 2b, the current detection circuit 5, the voltage control circuit 6, the power supply terminal 7, the output terminal 8, the transmit/receive switching circuit 9, and the antenna 10 are the same as those in the first embodiment, and thus the description thereof will be omitted. The last amplification circuit 2d which makes a difference from the first embodiment will be described below with reference to the drawings. FIG. 8 is a diagram illustrating a configuration of the last amplification circuit 2d.

The last amplification circuit 2d shown in FIG. 8 has a first terminal 4a, a second terminal 4b, a third terminal 4c, a fourth terminal 4d, a sixth terminal 4f, a seventh terminal 4g, a current control circuit 20, and a power amplification circuit 21. The current control circuit 20 includes transistors FET0 to FETn and a resistor 13. The power amplification circuit 21 includes capacitors C0 to Cn and transistors Tr0 to Trn. The circuit configuration of the current control circuit 20 and the power amplification circuit 21 will be described below.

In the current control circuit 20, there are n+1 branch paths from the fourth terminal 4d. One Nch transistor FET is arranged in each path. In the path in which the transistor FET0 is arranged, the resistor 13 is arranged. In order that the transistors FET0 to FETn can be simultaneously switched between a conduction state and a blocking state, the transistors FET0 to FETn are connected to one another by a common signal line. In the power amplification circuit 21, n+1 transistors Tr0 to Trn are provided so as to correspond to the n+1 paths, respectively. The capacitors C0 to Cn each for preventing direct current flow are provided between adjacent paths. The configuration of the last amplification circuit 2d will be described in detail below.

The gates of the transistors FET0 to FETn are connected to the first terminal 4a. In addition, as shown in FIG. 7, the first terminal 4a is connected to the voltage control circuit 6. The drains of the transistors FET1 to FETn and the resistor 13 are connected to the second terminal 4b. In addition, as shown in FIG. 7, the second terminal 4b is connected to the power supply terminal 7. The resistor 13 and the drain of the transistor FET0 are connected to each other. The third terminal 4c and the fourth terminal 4d are connected to both ends of the resistor 13, respectively.

The transistors Tr0 to Trn are arranged so as to correspond to the paths, respectively. Specifically, the collector of the transistor Tr0 is connected to a source of the transistor FET0 and to the seventh terminal 4g through the capacitor C0. The emitter of the transistor Tr0 is grounded. The base of the transistor Tr0 is connected to the sixth terminal 4f. The transistors Tr1 to Trn are connected in the same manner as the transistor Tr0. The capacitor C0 is provided between the collector of the transistor Tr0 and the seventh terminal 4g. The capacitor C1 is provided between the collector of the transistor Tr1 and the collector of the transistor Tr0. The capacitors C2 to Cn are connected in the same manner as the capacitor C1.

The roles of the components of the current control circuit 20 and power amplification circuit 21 configured in the above-described manner will be described below. A control signal from the voltage control circuit 6 is inputted to the first terminal 4a. A consumption current Ids from the power supply terminal 7 is inputted to the second terminal 4b. When the transistors FET0 to FETn are in a conduction state, the consumption current Ids is divided among the n+1 paths. Here, the consumption currents flowing through the transistors FET0 to FETn are referred to as consumption currents Ids0 to Idsn, respectively. The consumption currents Ids0 to Idsn have substantially the same magnitude, as described in the first embodiment. Thus, the relationship such that Ids=(n+1)Ids0 is established. The resistor 13 causes a voltage drop when the consumption current Ids0 flows across the resistor 13. The third terminal 4c and the fourth terminal 4d output potentials at their respective locations. That is, the potential difference between the third terminal 4c and the fourth terminal 4d is the voltage drop occurred in the resistor 13.

The transistors FET0 to FETn are switches for switching their corresponding paths between a conduction state and a blocking state. The transistors FET0 to FETn may be formed by the same fabrication process and on the same semiconductor substrate, for example. Therefore, the characteristics are consistent from transistor to transistor, and thus characteristic differences among individuals are assumed to be negligible. Note that the transistors FET0 to FETn are not limited to FETs, and may be active elements such as bipolar transistors or heterojunction bipolar transistors.

The transistors Tr0 to Trn each amplify a transmit signal using the consumption currents Ids0 to Idsn inputted to the collectors thereof. Although in the first embodiment the last amplification circuit 2c amplifies a transmit signal using a single bipolar transistor, in the present embodiment the transmit signal is amplified using a plurality of bipolar transistors. The capacitors C0 to Cn each prevent direct current flow between the collectors of adjacent transistors Tr0 to Trn.

The operation of the power amplifier module configured in the above-described manner will be described below. Note that the operations of the components of the power amplifier module according to the present embodiment, other than the operation of the last amplification circuit 2d, are the same as those described in the first embodiment, and thus the description of the common operations will be omitted.

First, in normal operation, the transistors FET0 to FETn are in a conduction state. Therefore, a consumption current Ids is inputted to the current control circuit 20 through the power supply terminal 7. Here, the current control circuit 20 divides the consumption current Ids among n+1 paths. That is, consumption currents Ids0 to Idsn flow through the transistors FET0 to FETn.

The consumption currents Ids0 to Idsn are inputted to the transistors Tr0 to Trn. A transmit signal amplified by the middle amplification circuit 2b is inputted, as a base current, to the transistors Tr0 to Trn from the sixth terminal 4f. Then, the transmit signal amplified by the transistors Tr0 to Trn is outputted to the transmit/receive switching circuit 9 through the seventh terminal 4g.

The total of the consumption currents Ids0 to Idsn inputted to the transistors Tr0 to Trn is equal to the consumption current Ids. Thus, the consumption current Ids having the same magnitude as the consumption current Ids inputted to the last amplification circuit 2c of the first embodiment is inputted to the power amplification circuit 21. That is, according to the power amplifier module of the present embodiment, the same amplification effect as that obtained in the first embodiment can be obtained.

In the case where the antenna 10 is damaged, for example, the same operation as that described in the first embodiment is performed, and the transistors FET0 to FETn are controlled to be in a blocking state. By this, it is possible to prevent overcurrent from flowing through the transistors Tr0 to Trn.

As described above, according to the power amplifier module of the present embodiment, as with the power amplifier module according to the first embodiment, damage to the power amplifier due to overcurrent caused by reflected power can be prevented, and a loss of consumption current caused by the detection of the overcurrent can be reduced. These advantages will be described in detail below with reference to the drawings.

In the conventional power amplifier module shown in FIG. 14, all consumption currents inputted from the power supply terminal pass through the resistor 104 and then are inputted to the power amplifier 101. Thus, in the resistor 104, a voltage drop occurs which is equal to the product of the magnitude of a consumption current supplied to the power amplifier 101 and the magnitude of the resistor 104.

On the other hand, in the power amplifier module according to the present embodiment, as shown in FIG. 8, a consumption current Ids is divided into consumption currents Ids0 to Idsn. Thus, the consumption current Ids0 flowing through the resistor 13 is about 1/n+1 of the consumption current Ids. Hence, the voltage drop occurring in the resistor 13 is smaller than that of conventional cases. Accordingly, a loss of consumption current caused by the detection of overcurrent can be reduced.

Figure 9:
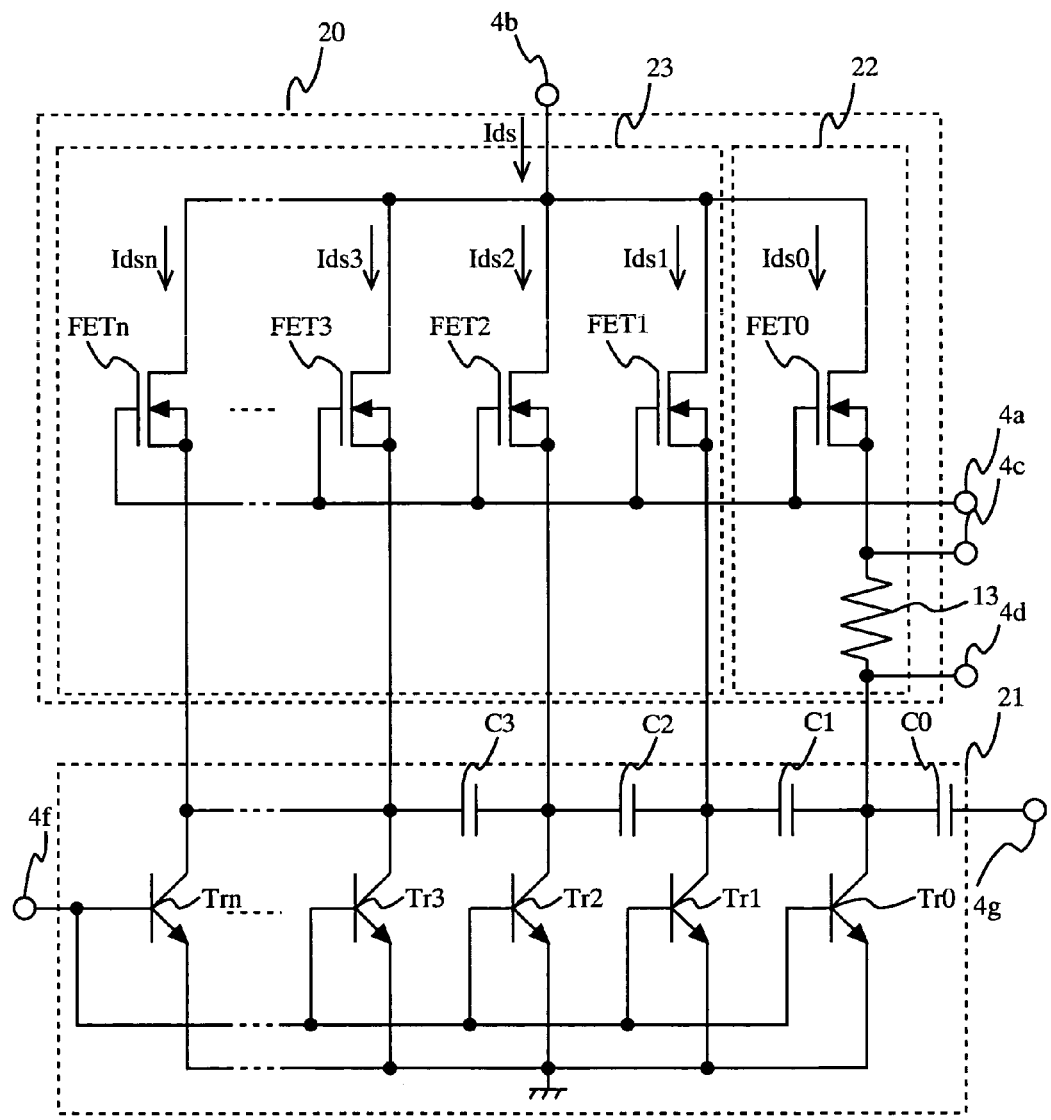
FIG. 9 is a diagram illustrating another exemplary configuration of the current control circuit according to the second embodiment.

As in the first embodiment, in the power amplifier module according to the present embodiment too, as shown in FIG. 9, the positions of the transistor FET0 and the resistor 13 may be reversed relative to each other.

Alternatively, as in the first embodiment, in the power amplifier module according to the present embodiment too, a VR 14 may be used instead of a resistor 13.

(Third Embodiment)

Figure 10:
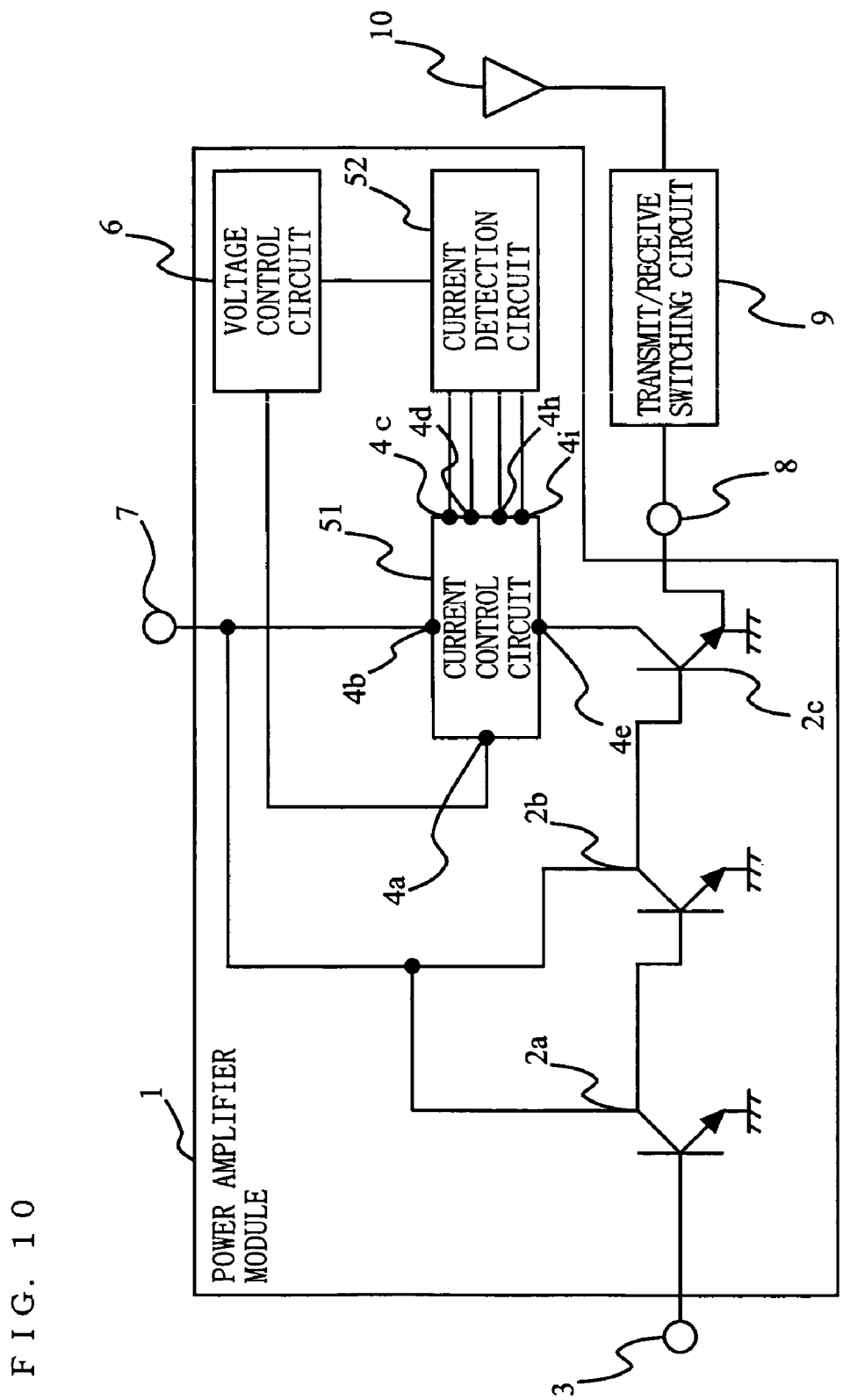
FIG. 10 is a diagram illustrating a configuration of a power amplifier module according to a third embodiment.

A power amplifier module according to a third embodiment of the present invention will be described below with reference to the drawings. The power amplifier module according to the present embodiment differs from the power amplifier module according to the first embodiment in that while in FIG. 4 only one VR 14 is provided, in the present embodiment a plurality of VRs 14 are provided. This enables detection of temperature at a plurality of points in the power amplifier module. FIG. 10 is a diagram illustrating a configuration of the power amplifier module according to the present embodiment.

The power amplifier module shown in FIG. 10 includes a first amplification circuit 2a, a middle amplification circuit 2b, a last amplification circuit 2c, an input terminal 3, a voltage control circuit 6, a power supply terminal 7, an output terminal 8, a transmit/receive switching circuit 9, a current control circuit 51, and a current detection circuit 52. In addition, an antenna 10 is connected to the power amplifier module via the output terminal 8.

Note that the first amplification circuit 2a, the middle amplification circuit 2b, the last amplification circuit 2c, the input terminal 3, the voltage control circuit 6, the power supply terminal 7, the output terminal 8, the transmit/receive switching circuit 9, and the antenna 10 are the same as those in the first embodiment, and thus the description thereof will be omitted.

Figure 11:
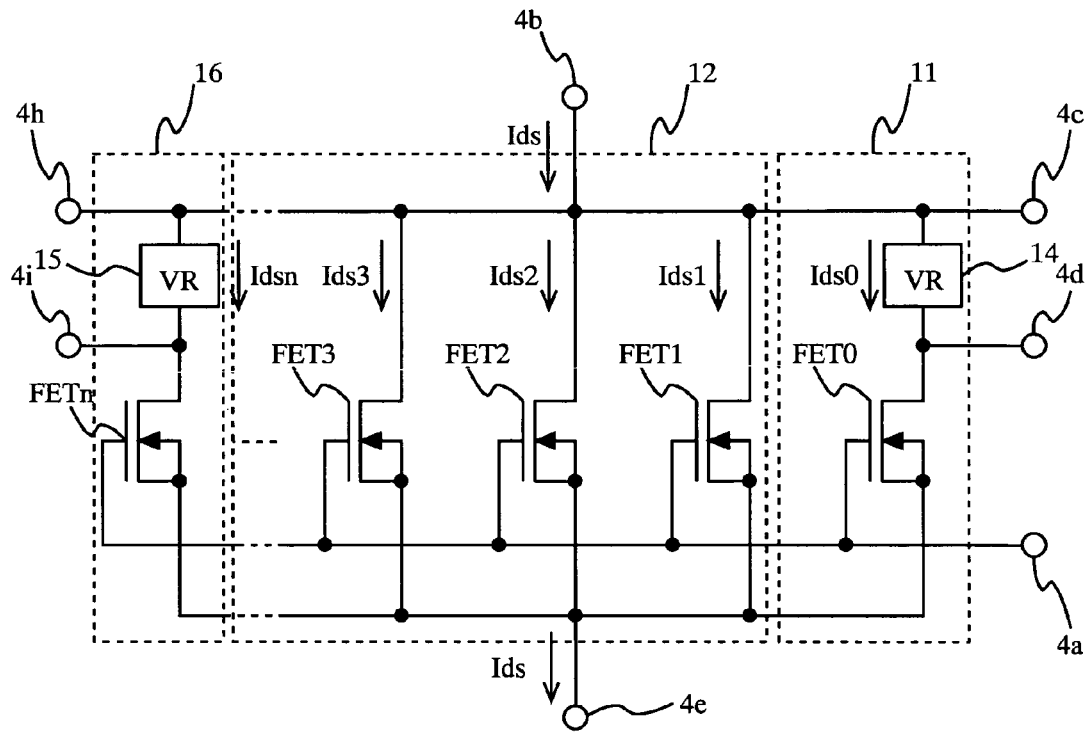
FIG. 11 is a diagram illustrating an exemplary configuration of a current control circuit according to the third embodiment.

The current control circuit 51 will be described below with reference to the drawing. FIG. 11 is a diagram illustrating a configuration of the current control circuit 51. The current control circuit 51 shown in FIG. 11 has a first terminal 4a, a second terminal 4b, a third terminal 4c, a fourth terminal 4d, a fifth terminal 4e, an eighth terminal 4h, a ninth terminal 4i, a current detection section 11, a current control section 12, and a current detection section 16. The current detection section 11 includes a VR 14 and a transistor FET0. The current control section 12 includes transistors FET1 to FETn−1 (n is a natural number). The current detection section 16 includes a VR 15 and a transistor FETn. The circuit configuration of the current control circuit 51 will be described below.

In the current control circuit 51 according to the present embodiment, there are n+1 branch paths between the fourth terminal 4d and the fifth terminal 4e, and one Nch transistor FET is arranged in each path. In the path in which the transistor FET0 is arranged, the VR 14 is arranged. In order that the transistors FET0 to FETn can be simultaneously switched between a conduction state and a blocking state, the transistors FET0 to FETn are connected to one another by a common signal line. In the present embodiment, in the path in which the transistor FETn is arranged, the VR 15 is arranged. The configuration of the current control circuit 51 will be described in detail below. Note that since the current control circuit 51 according to the present embodiment is the same as the current control circuit of the first embodiment except for the current detection section 16, only the current detection section 16 will be described.

In the current detection section 16, the VR 15 and the transistor FETn are connected in series. The eighth terminal 4h and the ninth terminal 4i are connected to both ends of the VR 15, respectively. The VR 15 is an element having the same characteristics as the VR 14, and has negative temperature characteristics. The eighth terminal 4h and the ninth terminal 4i detect potentials at both ends of the VR 15, respectively. The transistor FETn switches its corresponding path between a conduction state and a blocking state.

It is desirable that the VR 14 and the VR 15 be arranged apart from each other in the power amplifier module, so that temperatures at a plurality of points in the power amplifier module are detected and the transistors FET0 to FETn are controlled based on the detected temperatures.

Figure 12:
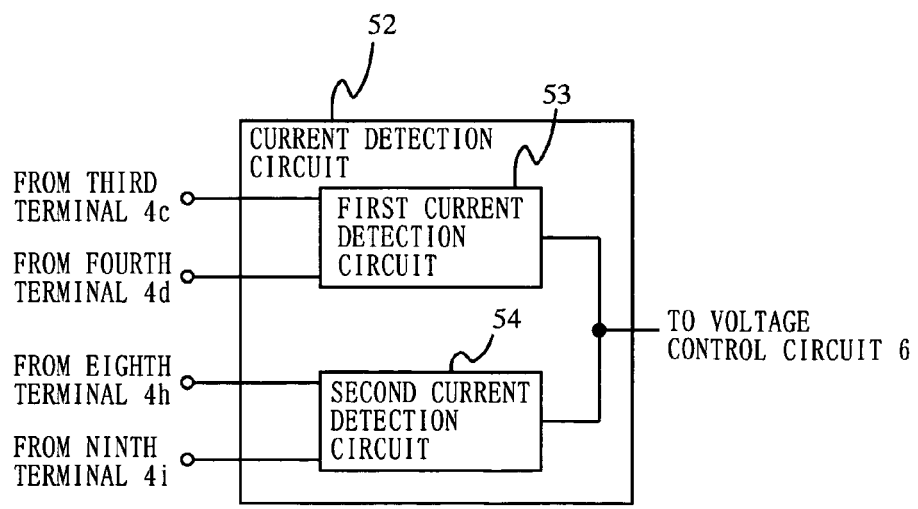
FIG. 12 is a diagram illustrating a configuration of a current detection circuit according to the third embodiment.

Now, the current detection circuit 52 according to the present embodiment will be described with reference to the drawings. FIG. 12 is a diagram illustrating a configuration of the current detection circuit 52 according to the present embodiment. The current detection circuit 52 outputs a signal having a voltage based on the magnitude of the consumption current Ids0 flowing through the VR 14 and the magnitude of the consumption current Idsn flowing through the VR 15. Specifically, the current detection circuit 52 detects the magnitude of the consumption current Ids0 flowing through the VR 14 and the magnitude of the consumption current Idsn flowing through the VR 15, and then outputs a signal having a voltage based on a greater magnitude between the consumption currents Ids0 and Idsn. The current detection circuit 52 includes a first current detection circuit 53 and a second current detection circuit 54.

The first current detection circuit 53 outputs a signal having a voltage based on the magnitude of the consumption current Ids0 flowing through the VR 14. The third terminal 4c and the fourth terminal 4d are connected to the first current detection circuit 53. The second current detection circuit 54 outputs a signal having a voltage based on the magnitude of the consumption current Idsn flowing through the VR 15. The eighth terminal 4h and the ninth terminal 4i are connected to the second current detection circuit 54.

The operation of the power amplifier module according to the present embodiment configured in the above-described manner will be described below. Note that the operation of the power amplifier module is basically the same as that of the power amplifier module which includes the current control circuit 41 shown in FIG. 4, and thus only differences will be described below.

The power amplifier module generates heat when in operation. Thus, during operation, the temperatures of the VR 14 and the VR 15 increase. Since the VR 14 and the VR 15 are provided apart from each other in the power amplifier module, the VR 14 and the VR 15 have different temperatures and accordingly have different resistance values. As an example, the following describes the case where the temperature of the periphery of the VR 14 is higher than that of the VR 15.

In the case where temperature distribution is such as that described above, the resistance value of the VR 14 is lower than that of the VR 15. Therefore, a consumption current Ids0 is higher than a consumption current Idsn. The first current detection circuit 53 detects the magnitude of the consumption current Ids0 and then outputs a voltage based on the magnitude of the consumption current Ids0. On the other hand, the second current detection circuit 54 detects the magnitude of the consumption current Idsn and then outputs a voltage based on the magnitude of the consumption current Idsn. As described above, since the consumption current Ids0 is higher than the consumption current Idsn, the current detection circuit 52 outputs the voltage based on the magnitude of the consumption current Ids0. Thereafter, the voltage control circuit 6 controls the transistors FET0 to FETn to be in either a conduction state or a blocking state, in accordance with the outputted voltage. Note that since the operation of the voltage control circuit 6 is the same as that described in the first embodiment, the description thereof will be omitted.

As described above, according to the power amplifier module of the present embodiment, as with the power amplifier module according to the first embodiment, damage to the power amplifier due to overcurrent caused by reflected power can be prevented, and a loss of consumption current caused by the detection of the overcurrent can be reduced.

In addition, according to the power amplifier module of the present embodiment, as with the power amplifier module of the first embodiment which includes the current control circuit shown in FIG. 4, thermal runaway of the last amplification circuit 2c can be prevented.

Figure 13:
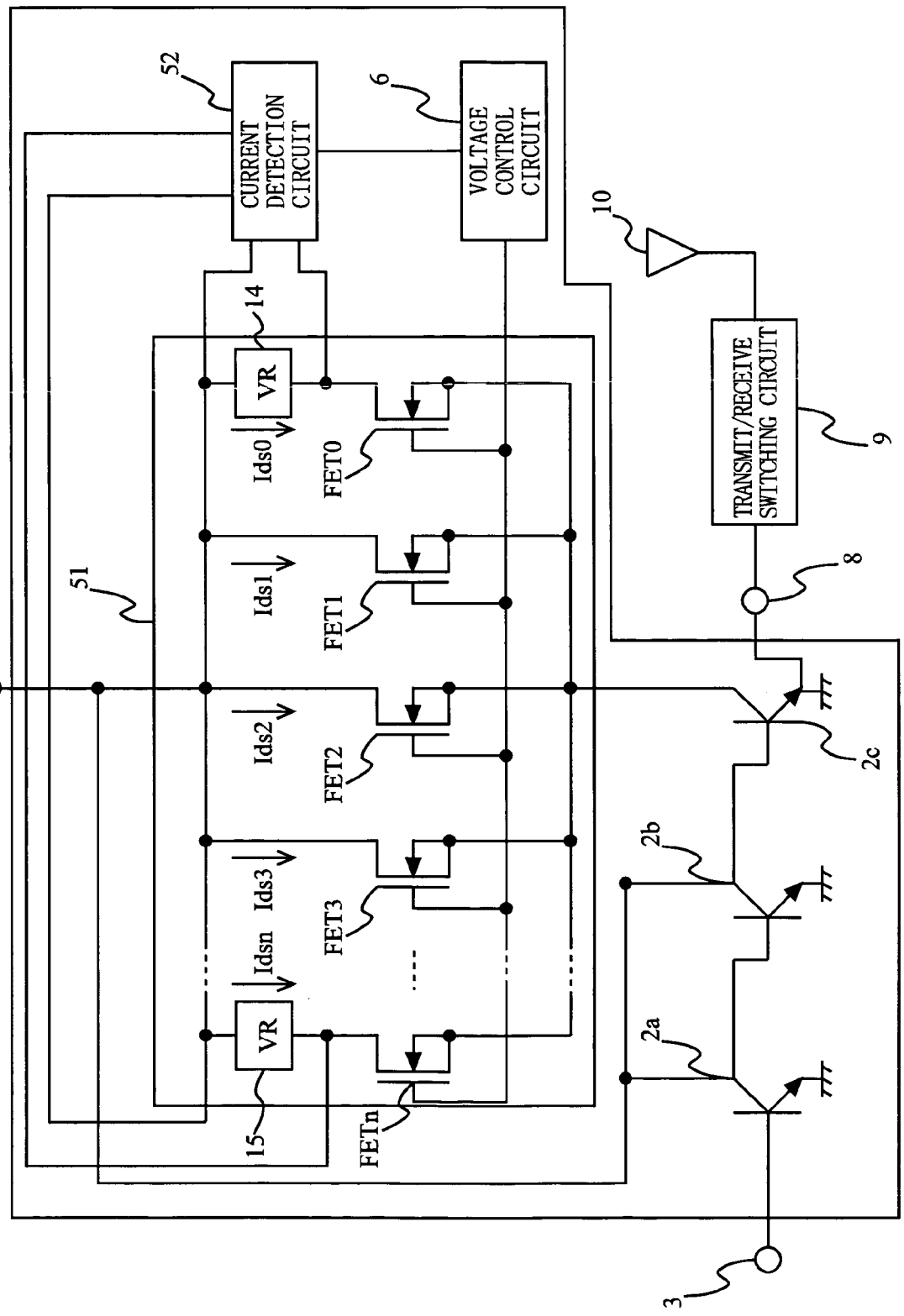
FIG. 13 is a diagram showing the arrangement of components of the power amplifier module according to the third embodiment.

According to the power amplifier module of the present embodiment, temperatures at a plurality of points are detected and the transistors are controlled to be in either a conduction state or a blocking state based on the detected temperatures. Therefore, the transistors can be controlled more precisely compared to the power amplifier module of the first embodiment which includes the current control circuit shown in FIG. 4. In order that such an advantage is exhibited more conspicuously, it is desirable that, as shown in FIG. 13, the VR 14 and the VR 15 be arranged as far apart as possible from each other in the power amplifier module. Although in FIG. 11 two VRs are provided, the number of VRs to be provided is not limited thereto.

Although, in the first to third embodiments, the number of amplification circuits is three, i.e., a first amplification circuit, a middle amplification circuit, and a last amplification circuit, the number of amplification circuits is not limited thereto; therefore, one or more than one amplification circuit(s) may be provided.

The power amplifier modules according to the present invention have advantages in that they are capable of preventing a power amplifier from being damaged due to overcurrent caused by reflected power, and of reducing a loss of consumption current caused by the detection of the overcurrent.

While the invention has been described in detail, the foregoing description is in all aspects illustrative and not restrictive. It is understood that numerous other modifications and variations can be devised without departing from the scope of the invention.

What is claimed is:

1. A power amplifier module comprising:
   an amplifier for amplifying a transmit signal and outputting the amplified transmit signal to an antenna;
   a drive current input terminal to which a drive current for driving the amplifier is inputted; and
   a current divider circuit provided between the drive current input terminal and the amplifier, for dividing the drive current among a plurality of paths, wherein
   the current divider circuit includes:
   a plurality of switching elements provided in the paths, respectively, and switched between a conduction state and a blocking state; and
   a resistance element provided in at least one of the plurality of paths, and
   the power amplifier module further comprises:
   a detection section for detecting an electrical parameter in the resistance element; and
   a control section for switching the plurality of switching elements between a conduction state and a blocking state, based on the electrical parameter detected by the detection section.

2. The power amplifier module according to claim 1, wherein the detection section detects a value of a current flowing through the resistance element as the electrical parameter.

3. The power amplifier module according to claim 2, wherein if the detection section detects a current value greater than a predetermined current value, the control section switches all of the switching elements from a conduction state to a blocking state.

4. The power amplifier module according to claim 3, wherein
   the plurality of switching elements are composed of transistors, and
   if the detection section detects a current value greater than the predetermined value, the control section applies a threshold voltage at which the transistors are switched to a conduction state from a blocking state, to control electrodes of the transistors.

5. The power amplifier module according to claim 1, wherein the detection section detects a potential difference generated across the resistance element as the electrical parameter.

6. The power amplifier module according to claim 1, wherein the resistance element is a thermal element having properties that a resistance value decreases as a temperature of a periphery of the resistance element increases.

7. The power amplifier module according to claim 4, wherein the resistance element is a thermal element having properties that a resistance value decreases as a temperature of a periphery of the resistance element increases,
the thermal element is provided in two or more of the plurality of paths, and
the detection section detects a highest current among currents of the thermal elements.

8. The power amplifier module according to claim 1, wherein
the amplifier is composed of a plurality of amplification transistors provided so as to correspond to the plurality of paths, respectively, and
the amplification transistors each amplify the transmit signal using drive currents flowing through their corresponding paths.

* * * * *